(12) United States Patent  (10) Patent No.: US 7,301,363 B1
Ruddy  (45) Date of Patent: Nov. 27, 2007

(54) METHOD AND SYSTEM FOR IMPROVING COMMUNICATION BETWEEN LOGIC ELEMENTS IN AN INTEGRATED CIRCUIT

(75) Inventor: Paul Ruddy, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 161 days.

(21) Appl. No.: 11/148,145

(22) Filed: Jun. 8, 2005

(51) Int. Cl.
*H03K 19/003* (2006.01)
(52) U.S. Cl. .......................................... 326/26; 326/101
(58) Field of Classification Search .................. 326/26, 326/21, 31, 101, 47
See application file for complete search history.

(56) References Cited

U.S. PATENT DOCUMENTS

| 4,949,275 A | | 8/1990 | Nonaka |
| 6,456,117 B2 * | | 9/2002 | Tanaka ........................ 326/101 |
| 6,828,852 B2 * | | 12/2004 | Klass et al. .................. 327/564 |
| 6,844,576 B2 | | 1/2005 | Ono |
| 7,145,361 B1 * | | 12/2006 | Rohe et al. ................... 326/47 |

* cited by examiner

*Primary Examiner*—James H. Cho
(74) *Attorney, Agent, or Firm*—Trellis Intellectual Property Law Group, PC

(57) ABSTRACT

A method, apparatus and machine-readable medium for improving communication between logic elements in an integrated circuit (IC) is provided. This is achieved by using a point-to-point approach for IC placement and routing, to address the increase in complexity in terms of design size and/or Deep Sub-Micron physical effects. The method involves providing a separate conductor member between an output of a logic element and each of one or more logic elements for interconnecting the one or more logic elements with the logic element. The method further involves providing a separate buffer between the output of the logic element and each of the one or more logic elements for interconnecting the one or more logic elements with the logic element. Furthermore, the method involves interconnecting the output of the logic element and the one or more logic elements, using the provided separate conductor member, and the provided separate buffer.

16 Claims, 4 Drawing Sheets

METHOD AND SYSTEM FOR IMPROVING COMMUNICATION BETWEEN LOGIC ELEMENTS IN AN INTEGRATED CIRCUIT

BACKGROUND OF THE INVENTION

1. Field of Invention

Embodiments of the invention relate in general to integrated circuits. More specifically, the embodiments of the invention relate to the methods and systems for improving communication between logic elements in an integrated circuit.

2. Description of the Background Art

Integrated circuits (ICs) are typically designed by using automated placement and routing of functional cells (standard cells). Currently, an automated IC physical design involves various stages of placing functional cells on a layout. This is followed by routing wires between the cells and optimization of the cells and wires in the physical design.

Further, the advancement in semiconductor technology makes the physical design process increasingly complex. Thus, it becomes difficult for the methodology and computing hardware to deal with the increasing size of physical designs. A Deep Sub-Micron (DSM) process technology demands more in-depth analysis, in order to deal with increasing assortments of physical effects that impact the design performance or reliability. In-depth analysis involves increasing the types of analysis, number of conditions, resolution of the analysis, etc. Thus, DSM physical design algorithms need to be highly complex in order to address a wide variety of circuit topologies coupled with DSM physical effects.

Specifically, the operating behavior of many DSM application-specific ICs (ASICs) is primarily being determined by the characteristics of the wires, rather than the performance of the gates. The most computational-intensive analysis and optimization steps being performed during a DSM physical design are concentrated on the wires. The conventional techniques for physical design are, however, gate-oriented, even though the physical design issues are predominantly wire-oriented.

The methods and systems for approaching IC placement and routing, to address the increase in complexity in terms of design size and/or DSM physical effects, are known in the art. However, conventional methods do not permit easy layout and analysis. The methods do not focus on, and facilitate implementation of the wires. The existing methods do not enable simplified physical topologies, and decoupling of DSM physical effects. Therefore, the above-mentioned limitations of the conventional designing process may result in impaired communication between the logic cells. Impaired communication between the logic cells hinders timing and power optimization, as well as other operational characteristics of the physical design.

DETAILED DESCRIPTION OF EMBODIMENTS OF THE INVENTION

Various embodiments of the invention provide a method, apparatus and machine-readable medium for improving communication between logic elements in an integrated circuit (IC). Improved communication between logic elements in an IC may result in the optimization of power, timing, or other operational characteristics. The embodiments of the invention further provide ICs, wherein pairs of logic elements are primarily interconnected via buffers and conducting members—a point-to-point (P2P) approach for IC interconnections. In addition to improving communication between logic elements, the P2P approach addresses the increase in IC complexity in terms of design size and/or Deep Sub-Micron (DSM) physical effects.

The method involves providing a separate conductor member between an output of a logic element and each of one or more logic elements. The separate conductor members can be used for interconnecting each of one or more logic elements with the output of the logic element. The method further involves providing a separate buffer between the output of the logic element and each of one or more logic elements for interconnecting the one or more logic elements with the logic element. Furthermore, the method involves interconnecting the output of the logic element and one or more logic elements, using the provided separate conductor members, and the provided separate buffers.

Figure 1:
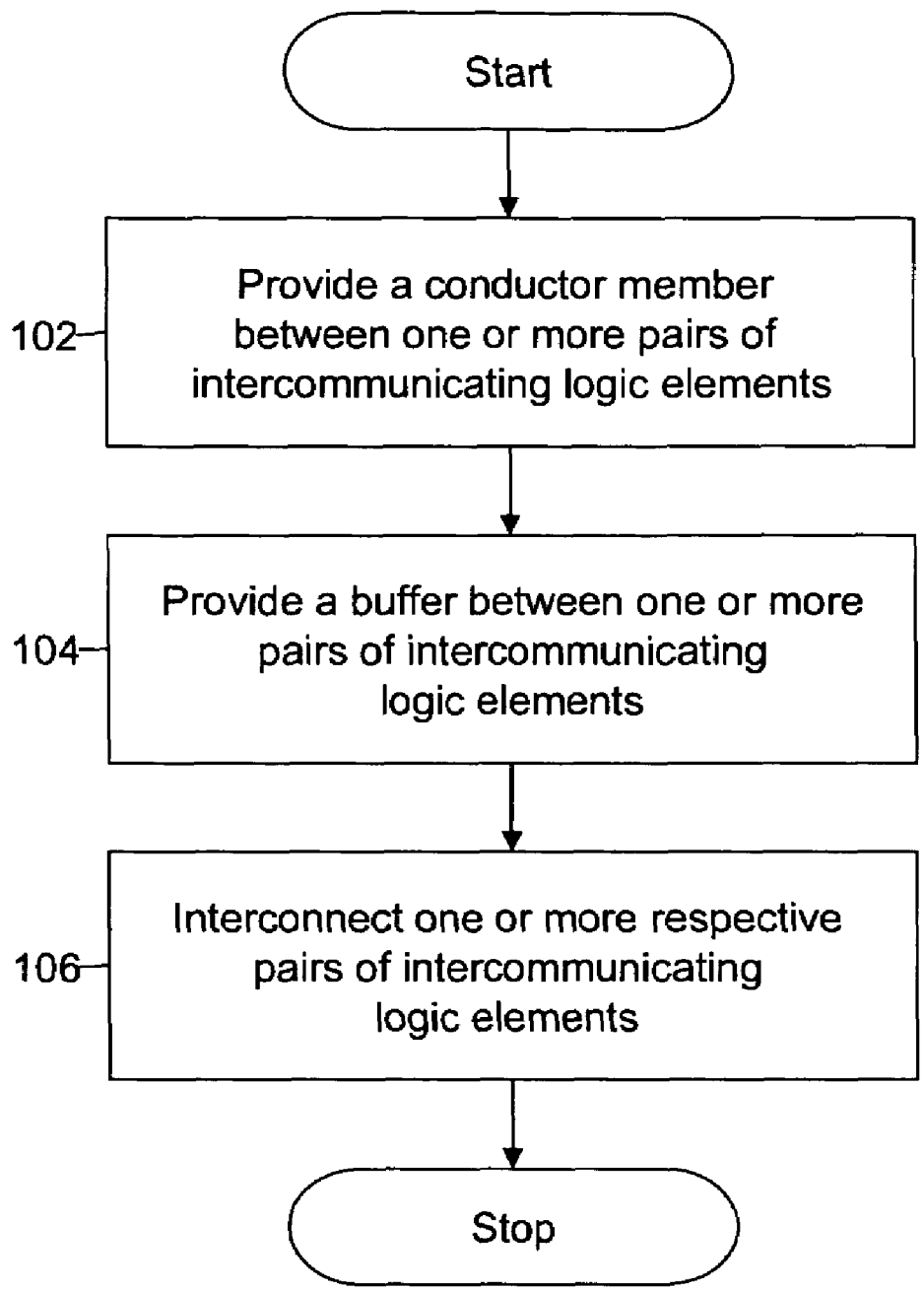
FIG. 1 illustrates a flowchart of a method for improving communication between logic elements in an integrated circuit, in accordance with an exemplary embodiment of the invention.
Figure 2:
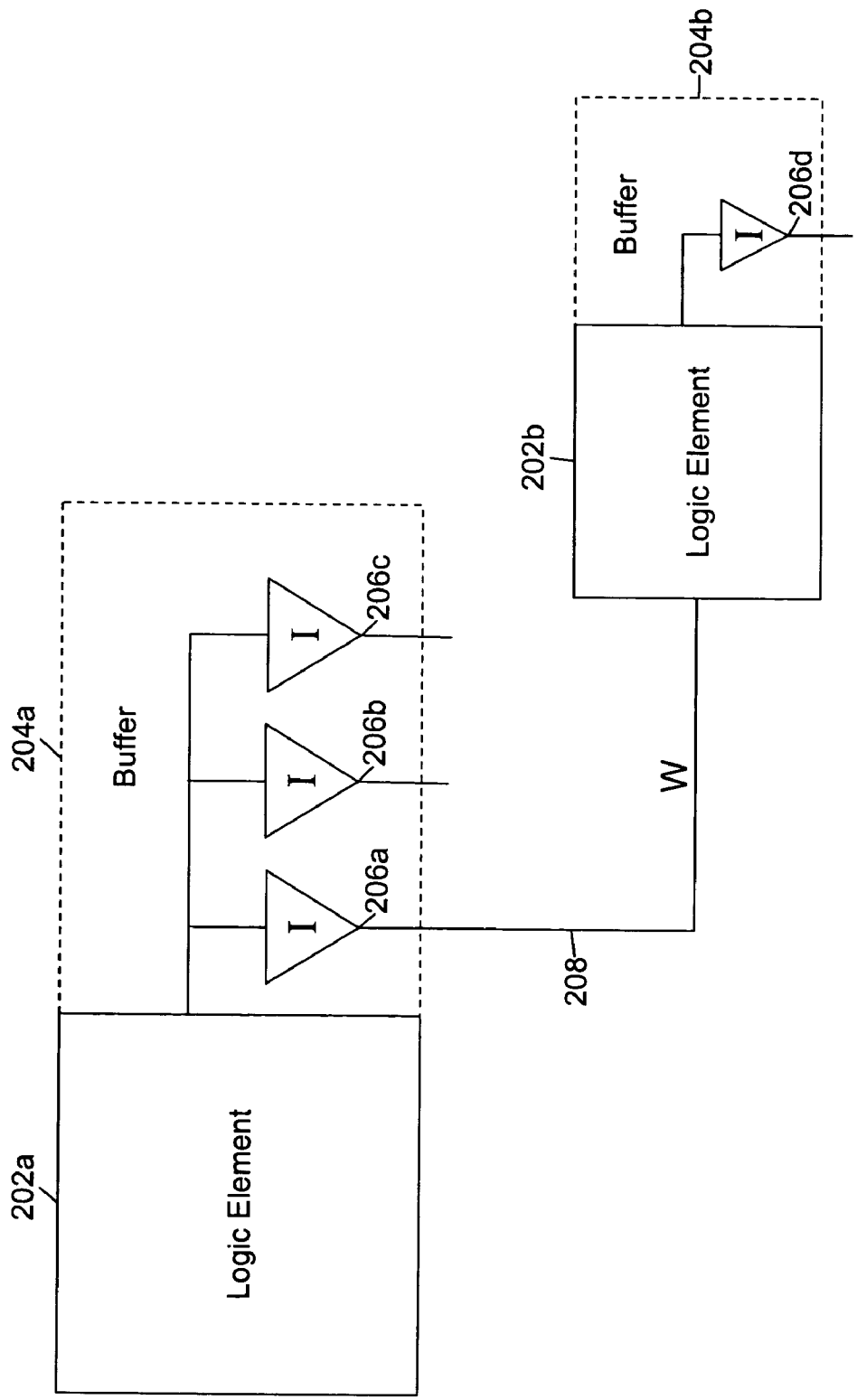
FIG. 2 is an illustration of an exemplary embodiment of a logic element, and a set of buffers.

FIG. 1 illustrates a flowchart of a method for improving communication between logic elements in an IC, in accordance with an exemplary embodiment of the invention. At step 102, a separate conductor member is provided between an output of a logic element and each of one or more logic elements. The separate conductor members are provided in order to interconnect the one or more logic elements with the logic element. In an embodiment of the invention, the separate conductor member is an individual wire disposed between the output of the logic element and one or more logic elements. In various embodiments of the invention, logic element (as shown in FIG. 2) is a collection of one or more logic gates, which are combined to perform a logic function. The logic gates can be based on various IC families such as transistor-transistor logic (TTL), emitter-coupled logic (ECL), metal-oxide-semiconductor logic (MOS), complementary metal-oxide-semiconductor logic (CMOS), and so forth.

At step 104, a separate buffer is provided between the output of the logic element and each of one or more logic elements. The buffers are provided in order to interconnect the one or more logic elements with the logic element. The buffers are provided between the output of the logic element and the separate conductor members provided for the one or more logic elements. The buffer (as shown in FIG. 2), in combination with the conducting member, is used for distributing signals between the various pairs of intercommunicating logic elements. In various embodiments of the invention, the combination of the buffer and a wire connecting the buffer to a logic element, hereinafter referred to as Buffered Wire (BW), has a fanout of one. Providing an individual BW for pairs of intercommunicating logic elements identified in step 102 may result in a more optimal connection and further reduces the interaction between the output of the logic element and the separate conductor member.

In various embodiments of the invention, the BW is a basic unit of analysis for a P2P physical design. The BW unit allows simple and optimized models and analysis for DSM physical effects such as timing, Signal Integrity (SI), power, and so forth.

At step 106, the output of the logic element and one or more logic elements are interconnected. The interconnection is made by using the separate conductor members, and the separate buffers that are provided in steps 102 and 104 respectively. Step 106 is performed in such a way that the physical and electrical constraints affecting the design optimization are reduced. The physical constraints include the placement and routing and constraints associated with the physical design process. The electrical constraints are related to such DSM effects as timing, SI, power and so forth. Easing of physical and electrical constraints enables the optimization of every critical connection path with minimal effect from the constraints from any other connection path on the IC layout (ICL). This further facilitates separate handling of every P2P connection.

In an exemplary embodiment of the invention, the buffer and the separate conducting member combination is provided between each of the 70 percent or more pairs of intercommunicating logic elements. In another exemplary embodiment of the invention, the buffer and the separate conducting member combination is provided between each of the 80 percent or more pairs of intercommunicating logic elements. In yet another exemplary embodiment of the invention, the buffer and the separate conducting member are provided between each of the 90 percent or more pairs of intercommunicating logic elements.

In an embodiment of the invention, a logic element and the set of corresponding buffers that are used for interconnecting the output of the logic element to the one or more logic elements constitutes a compound cell. In an embodiment of the invention, the compound cell is assembled from a library of one or more interconnecting logic elements and the buffers. In an embodiment of the invention, the compound cells can be assembled as needed during the course of the design process. In an embodiment of the invention, a compound cell can be combined with other compound cells to form a 'super compound' cell, thereby reducing global Integrated Circuit Layout (ICL) routing and providing other benefits. The feature of collapsing compound cells into a super compound cell can be also be used to provide polarity inversion on logic element inputs, if required. Further, the feature of collapsing can be used pre-placement or post-placement. In some cases, a compound cell may be replicated in order to facilitate collapsing into one or more super compound cells.

Since all the BWs are individually buffered with a fanout equal to one, every BW connection between two compound cells is generated through a P2P signal routing. The connection between two compound cells is referred to as a P2P connection.

In various embodiments of the invention, the method can be implemented in the form of a software in a processor/computer as part of a computer-aided design (CAD) tool.

FIG. 2 is an illustration of an exemplary embodiment of a logic element, and a set of buffers. A logic element 202a has a set of buffers 204a adjacent to logic element 202a. Each of buffer set 204a, along with a corresponding conductor member, constitute a BW. For example, buffer 206a, along with conductor member 208, constitute a BW 210 between logic element 202a and logic element 202b. Buffers 206a, 206b, and 206c are each part of BWs having a fanout equal to one. Buffer 206a reduces the interaction between logic element 202a and conductor member 208. BW 210 reduces the interaction between logic element 202a and logic element 202b.

Logic element 202a has essentially '0' wire load due to buffer set 204a being physically adjacent to logic element 202a. As a result, the delay associated with logic element 202a primarily depends on signal characteristics associated with the logic element inputs, and is essentially independent of the wire load of the output interconnections to other logic elements, conductor member 208, for example. The output of logic element 202a drives only the physically adjacent buffers in buffer set 204a. As such, the load on the output of logic element 202a does not vary due to interconnect loading, resulting in a constant input signal characteristic to BW 210. Therefore, the delay associated with buffer 206a is primarily dependent on the wire load of conductor member 208. Consequently, the DSM physical effects associated with the inputs of a compound cell are effectively decoupled with those of the outputs.

Figure 3:
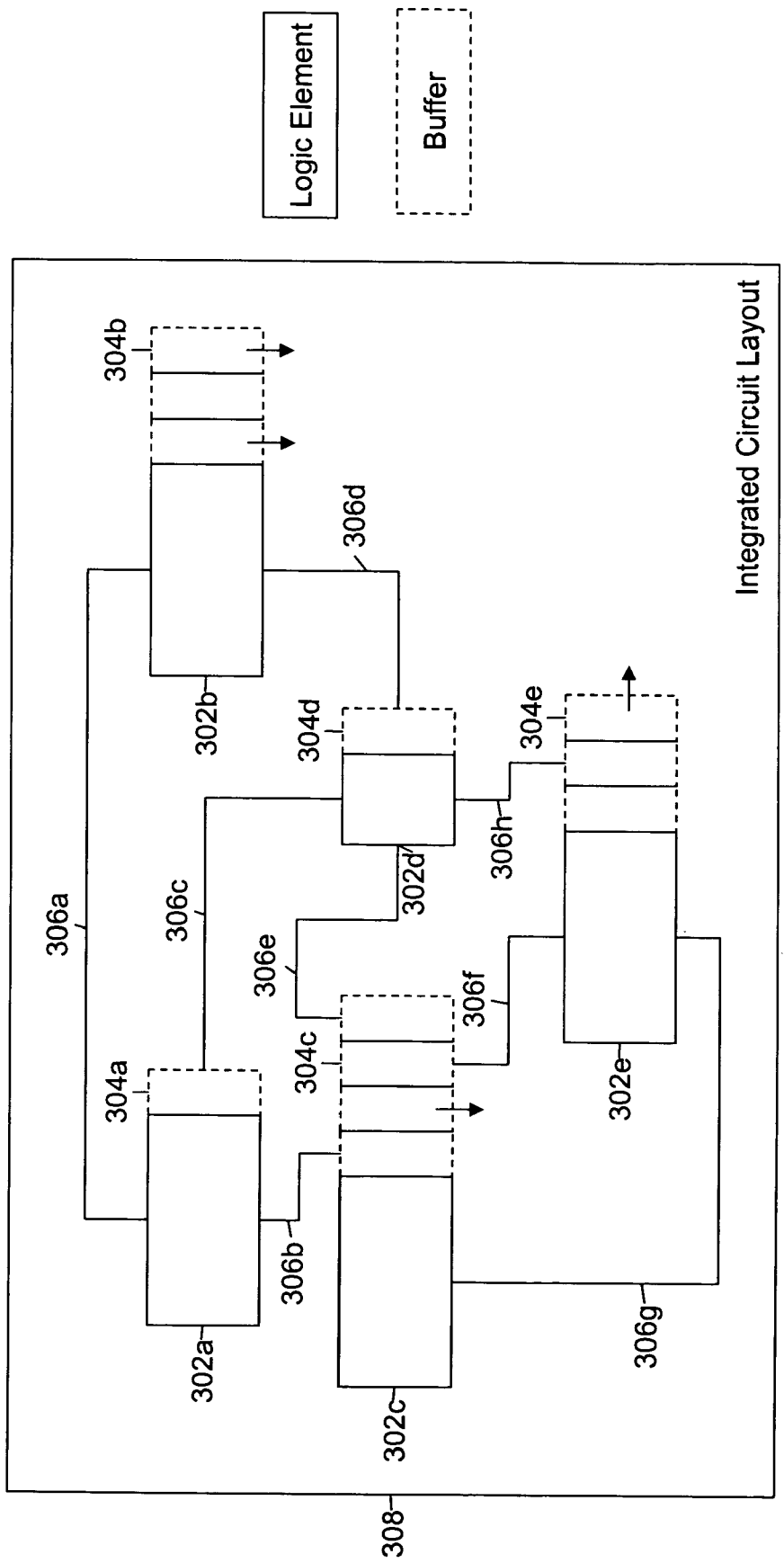
FIG. 3 is an illustration of an integrated circuit layout, in accordance to an exemplary embodiment of the invention.

FIG. 3 is an illustration of an integrated circuit, in accordance with an exemplary embodiment of the invention. IC 300 includes a plurality of intercommunicating logic elements 302a, 302b, 302c, 302d, and 302e. Logic elements 302a, 302b, 302c, 302d, and 302e can be assembled to create an ICL 308. ICL 308 may be a layout of an analog IC, a digital IC, or a mixed-signal IC. IC 300 further includes the means for assisting in the reduction of the interaction between the plurality of intercommunicating logic elements 302a, 302b, 302c, 302d, and 302e. The means for assisting in the reduction in the interaction include buffer sets 304a, 304b, 304c, 304d, and 304e. Buffer sets 304a, 304b, 304c, 304d, and 304e are adjacent to logic elements 302a, 302b, 302c, 302d, and 302e respectively. For example, buffer 304a is provided between the output of intercommunicating logic element 302a and intercommunicating logic element 302d. Furthermore, IC 300 includes conductor members 306a, 306b, 306c, 306d, 306e, 306f, 306g, and 306h. Conductor members 306a, 306b, 306c, 306d, 306e, 306f, 306g, and 306h are provided between each pair of intercommunicating logic elements. For example, conductor member 306a is provided between intercommunicating logic element 302b and intercommunicating logic element 302a.

Figure 4:
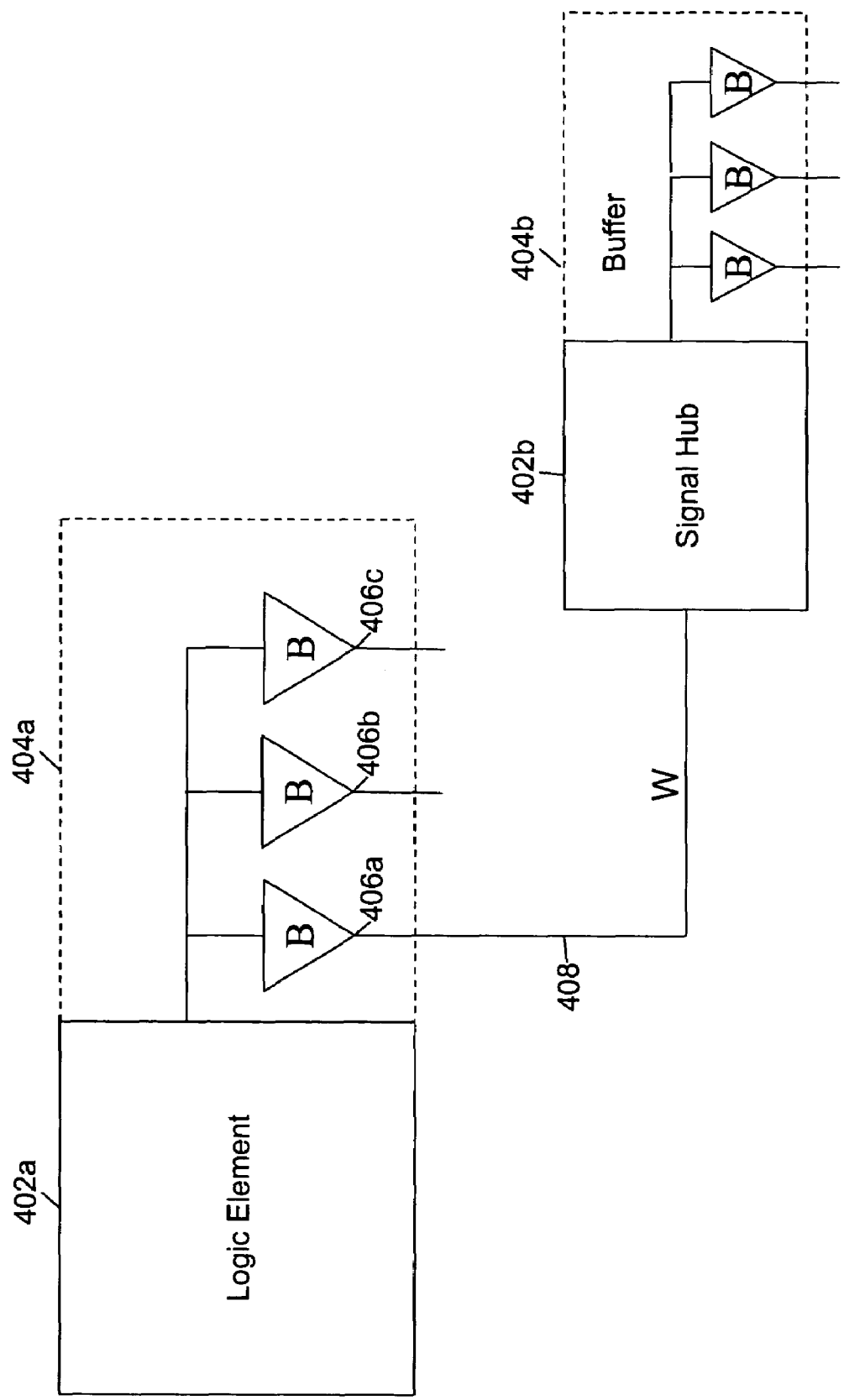
FIG. 4 is an illustration of an exemplary embodiment of a signal hub.

In an embodiment of the invention, a signal hub may be provided between one or more pairs of intercommunicating logic elements. The signal hub provides a means to replicate a BW interconnection into multiple BW interconnections (as shown in FIG. 4). FIG. 4 shows an exemplary a signal hub 402b for replicating the BW interconnections. Also shown in FIG. 4 are logic element 402a and a set of buffers 204a (i.e., buffers 406a, 406b, and 406c) adjacent the logic element 402a. Further shown are conductor member 408 and buffer set 404b adjacent to the signal hub 402b. The signal hub can be used to reduce the power or cell density, associated with the IC being designed.

In another embodiment of the invention, a signal repeater may be provided between one or more pairs of intercommunicating logic elements.

In yet another embodiment of the invention, a combination of signal hubs and signal repeaters may be provided between one or more pairs of intercommunicating logic elements.

Various embodiments of the invention have the advantage that the use of buffers with a fanout of one enables an efficient implementation of high-complexity DSM devices. Buffers with a fanout of one lead to the use of shorter and simpler BWs, making it easier to impose physical constraints on the wires. Shorter and simpler BWs therefore enable ease of routing, and analysis.

Further, P2P signal routing allows easier timing and power optimization. In P2P signal routing each interconnection has just one source and one destination, allowing path-by-path optimization. The path-by-path optimization enables optimization of each connection between intercommunication logic elements without constraints from multiple fanout paths. Further, due to the individual buffering of wires, critical paths in a network of logic elements may be more effectively segregated from non-critical paths. This segregation allows more advanced CAD algorithms and buffer circuits to be employed for those critical paths without affecting or interacting with non-critical paths.

In addition, P2P signal routing leads to a simpler, more uniform physical topology with the predominant use of BW for connections between intercommunicating logic elements, thereby allowing more efficient modeling of DSM physical effects. The simple physical topology can further result in the generation of a more efficient database, and faster computer-aided design (CAD) algorithms.

The P2P signal routing further allows ease of calculation of timing windows for signal integrity (SI) analysis. In addition, P2P signal routing results in simpler timing paths with a less overlap of timing arcs. This allows faster design closure.

Further, P2P signal routing permits localized tuning of a BW to address physical constraints, without affecting the design. The buffer of a BW may be incrementally changed to optimize a particular connection without significant impact of the physical layout of the IC.

In addition, On-Chip Variations on an IC have less impact since BW utilize a uniform means of driving the conductor members. Current practice allows for several topologies in the circuitry driving conductor members. Predominant use of BW for interconnection of intercommunicating logic elements leads to a greater correlation between the modeling of physical effects and the actual silicon behavior of the IC.

Further, various embodiments of the invention involves the use of compound cells. The compound cells decouple some DSM physical effects of cell inputs from cell outputs. The compound cells further facilitate physical design optimization by focusing on BWs instead of logic elements for the interconnections on an IC.

Although the invention has been discussed with respect to specific embodiments thereof, these embodiments are merely illustrative, and not restrictive, of the invention. For example, 'a method for designing an integrated circuit layout' can include any type of analysis, manual or automatic, to anticipate the needs of the method.

In the description herein for embodiments of the invention, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Also in the description herein for embodiments of the present invention, a portion of the disclosure recited in the specification contains material, which is subject to copyright protection. Computer program source code, object code, instructions, text or other functional information that is executable by a machine may be included in an appendix, tables, figures or in other forms. The copyright owner has no objection to the facsimile reproduction of the specification as filed in the Patent and Trademark Office. Otherwise all copyright rights are reserved.

A 'computer' for purposes of embodiments of the present invention may include any processor-containing device, such as a mainframe computer, personal computer, laptop, notebook, microcomputer, server, personal data manager or 'PIM' (also referred to as a personal information manager), smart cellular or other phone, so-called smart card, set-top box, or any of the like. A 'computer program' may include any suitable locally or remotely executable program or sequence of coded instructions, which are to be inserted into a computer, well known to those skilled in the art. Stated more specifically, a computer program includes an organized list of instructions that, when executed, causes the computer to behave in a predetermined manner. A computer program contains a list of ingredients (called variables) and a list of directions (called statements) that tell the computer what to do with the variables. The variables may represent numeric data, text, audio or graphical images. If a computer is employed for presenting media via a suitable directly or indirectly coupled input/output (I/O) device, the computer would have suitable instructions for allowing a user to input or output (e.g., present) program code and/or data information respectively in accordance with the embodiments of the present invention.

A 'computer readable medium' for purposes of embodiments of the present invention may be any medium that can contain, store, communicate, propagate, or transport the computer program for use by or in connection with the instruction execution system apparatus, system or device. The computer readable medium can be, by way of example only but not by limitation, an electronic, magnetic, optical, electromagnetic, infrared, or semiconductor system, apparatus, system, device, propagation medium, or computer memory.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Further, at least some of the components of an embodiment of the invention may be implemented by using a programmed general-purpose digital computer, by using application specific integrated circuits, programmable logic devices, or field programmable gate arrays, or by using a network of interconnected components and circuits. Connections may be wired, wireless, by modem, and the like.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A method for improving communication between logic elements in a custom integrated circuit design, comprising
providing a separate conductor member between an output of a logic element and each of a plurality of logic elements for interconnecting the plurality of logic elements with the logic element;
providing a separate buffer between the output of the logic element and each of the plurality of logic elements for interconnecting the plurality of logic elements with the logic element, the separate buffer being provided to reduce interaction between each of plurality of logic elements and the logic element; and
interconnecting the output of the logic element and the plurality of logic elements using the provided separate conductor member and the provided separate buffer in the custom integrated circuit design, wherein the logic element and separate buffer between the output of the logic element and each of the plurality of logic elements are included in a compound cell in a library that is placed in the custom integrated circuit design, wherein a point to point connection between the cell compound and each of the plurality of logic elements is formed using the separate buffer between the output of the logic element and each of the plurality of the logic elements.

2. The method of claim 1 wherein the separate buffer and the separate conductor member is provided between 70% or more respective pairs of intercommunicating logic elements.

3. The method of claim 1 wherein the separate buffer and the respective conducting member is provided between 80% or more respective pairs of intercommunicating logic elements.

4. The method of claim 1 wherein the separate buffer and the respective conducting member is provided between 90% or more respective pairs of intercommunicating logic elements.

5. The method of claim 1 additionally comprising providing a signal hub between at least one respective pair of intercommunicating logic elements.

6. The method of claim 1 additionally comprising providing a signal repeater between at least one respective pair of intercommunicating logic elements.

7. A method comprising:
providing a library including a compound cell, the compound cell including a logic element and a plurality of buffers connected to an output of the logic cell;
placing the compound cell in a custom integrated circuit design;
placing a plurality of logic elements in the design; and
connecting the compound cell to each of the plurality of logic elements using a plurality of point to point buffered wires, wherein a single buffered wire is connected between a buffer in the plurality of buffers and a logic element in the plurality of logic elements to form a point to point connection, wherein each buffered wire provides a fanout of one for the compound cell.

8. The method of claim 7, further comprising generating the compound cell during design of the integrated circuit design by combining the logic cell from the library and the plurality of buffers in the compound cell.

9. The method of claim 7, wherein interaction between the plurality of logic elements is reduced using the point to point buffered wires.

10. The method of claim 7, wherein an output of the compound cell is a single wire for each of the buffered wires providing a fan-out of one for buffered wire.

11. The method of claim 7, wherein the library includes a plurality of compound cells, each compound cell including a logic element and one or more buffers such that the compound cell can form point to point connections with one or more logic elements, the compound cells selectable and placeable in the custom integrated circuit design.

12. Software encoded in one or more tangible media for execution by the one or more processors and when executed operable to:
provide a library including a compound cell, the compound cell including a logic element and a plurality of buffers connected to an output of the logic cell;
place the compound cell in a custom integrated circuit design;
place a plurality of logic elements in the design; and
connect the compound cell to each of the plurality of logic elements using a plurality of point to point buffered wires, wherein a single buffered wire is connected between a buffer in the plurality of buffers and a logic element in the plurality of logic elements to form a point to point connection, wherein each buffered wire provides a fanout of one for the compound cell.

13. The software of claim 12, wherein the software when executed is further operable to generate the compound cell during design of the integrated circuit design by combining the logic cell from the library and the plurality of buffers in the compound cell.

14. The software of claim 12, wherein interaction between the plurality of logic elements is reduced using the point to point buffered wires.

15. The software of claim 12, wherein an output of the compound cell is a single wire for each of the buffered wires providing a fan-out of one for buffered wire.

16. The software of claim 12, wherein the library includes a plurality of compound cells, each compound cell including a logic element and one or more buffers such that the compound cell can form point to point connections with one or more logic elements, the compound cells selectable and placeable in the custom integrated circuit design.

* * * * *